(12) United States Patent
Nguyen et al.

(10) Patent No.: US 10,862,420 B2
(45) Date of Patent: *Dec. 8, 2020

(54) INTER-TILE SUPPORT FOR SOLAR ROOF TILES

(71) Applicant: TESLA, INC., Palo Alto, CA (US)

(72) Inventors: Peter P. Nguyen, San Jose, CA (US); Piotr Zajac, Foster City, CA (US); Bobby Yang, Dublin, CA (US)

(73) Assignee: Tesla, Inc., Palo Alto, CA (US)

( * ) Notice: Subject to any disclaimer, the term of this patent is extended or adjusted under 35 U.S.C. 154(b) by 30 days.

This patent is subject to a terminal disclaimer.

(21) Appl. No.: 15/900,636

(22) Filed: Feb. 20, 2018

(65) Prior Publication Data

US 2019/0260328 A1 Aug. 22, 2019

(51) Int. Cl.
| | |
|---|---|
| *H02S 20/25* | (2014.01) |
| *H02S 30/10* | (2014.01) |
| *H01L 31/048* | (2014.01) |
| *H01L 31/05* | (2014.01) |
| *H01L 31/042* | (2014.01) |
| *E01D 4/00* | (2006.01) |
| *B32B 27/00* | (2006.01) |

(52) U.S. Cl.
CPC ............. *H02S 20/25* (2014.12); *B32B 27/00* (2013.01); *E01D 4/00* (2013.01); *H01L 31/042* (2013.01); *H01L 31/048* (2013.01); *H01L 31/0488* (2013.01); *H01L 31/0508* (2013.01); *H02S 30/10* (2014.12)

(58) Field of Classification Search
CPC ......... H02S 20/25; H02S 30/10; B32B 27/00; E01D 4/00; H01L 31/042; H01L 31/0508; H01L 31/048; H01L 31/0488
See application file for complete search history.

(56) References Cited

U.S. PATENT DOCUMENTS

| | | |
|---|---|---|
| 3,076,861 A | 2/1963 | Samulon |
| 3,369,939 A | 2/1968 | Myer |
| 3,461,602 A | 8/1969 | Hasel |
| 4,239,810 A | 12/1980 | Alameddine |
| 4,724,011 A | 2/1988 | Turner |
| 5,118,540 A | 6/1992 | Hutchison |
| 5,338,369 A | 8/1994 | Rawlings |

(Continued)

FOREIGN PATENT DOCUMENTS

| | | |
|---|---|---|
| CN | 102544380 | 8/2015 |
| CN | 103426957 | 3/2016 |

(Continued)

OTHER PUBLICATIONS

JP-2000058894-A, Machine Translation, Oshima (Year: 2000).*

(Continued)

*Primary Examiner* — Devina Pillay
(74) *Attorney, Agent, or Firm* — Dentons US LLP

(57) ABSTRACT

One embodiment described herein provides a photovoltaic roof module. The roof module can include at least a first photovoltaic roof tile, a second photovoltaic roof tile positioned adjacent to the first photovoltaic roof tile, and a spacer coupled to and positioned between the first and second photovoltaic roof tiles. The spacer is configured to facilitate a semi-rigid joint between the first and second photovoltaic roof tiles.

13 Claims, 16 Drawing Sheets

(56) References Cited

U.S. PATENT DOCUMENTS

| | | |
|---|---|---|
| 5,427,961 A | 6/1995 | Takenouchi |
| 5,667,596 A | 9/1997 | Tsuzuki |
| 5,942,048 A | 8/1999 | Fujisaki |
| 6,133,522 A | 10/2000 | Kataoka |
| 6,311,436 B1 | 11/2001 | Mimura |
| 6,365,824 B1 | 4/2002 | Nakazima |
| 6,472,594 B1 | 10/2002 | Ichinose |
| 6,586,271 B2 | 7/2003 | Hanoka |
| 6,960,716 B2 | 11/2005 | Matsumi |
| 7,259,321 B2 | 8/2007 | Oswald |
| 7,276,724 B2 | 10/2007 | Sheats |
| 7,506,477 B2 | 3/2009 | Flaherty |
| 7,534,956 B2 | 5/2009 | Kataoka |
| 7,772,484 B2 | 8/2010 | Li |
| 7,833,808 B2 | 11/2010 | Xu |
| 7,851,700 B2 | 12/2010 | Luch |
| 7,858,874 B2 | 12/2010 | Ruskin |
| 7,902,451 B2 | 3/2011 | Shimizu |
| 7,964,440 B2 | 6/2011 | Salleo |
| 8,205,400 B2 | 6/2012 | Allen |
| 8,206,664 B2 | 6/2012 | Lin |
| 8,276,329 B2 | 10/2012 | Lenox |
| 8,471,141 B2 | 6/2013 | Stancel |
| 8,664,030 B2 | 3/2014 | Luch |
| 8,674,377 B2 | 3/2014 | Farquhar |
| 8,701,360 B2 | 4/2014 | Ressler |
| 8,713,861 B2 | 5/2014 | Desloover |
| 8,822,810 B2 | 9/2014 | Luch |
| 9,038,330 B2 | 5/2015 | Bellavia |
| 9,150,966 B2 | 10/2015 | Xu |
| 9,206,520 B2 | 12/2015 | Barr |
| 9,343,592 B2 | 5/2016 | Hunt |
| 9,362,527 B2 | 6/2016 | Takemura |
| 9,412,884 B2 | 8/2016 | Heng |
| 9,525,092 B2 | 12/2016 | Mayer |
| 9,825,582 B2 | 11/2017 | Fernandes |
| 9,899,554 B2 | 2/2018 | Yang |
| 9,966,487 B2 | 5/2018 | Magnusdottir |
| 2001/0054435 A1 | 12/2001 | Nagao |
| 2002/0015782 A1 | 2/2002 | Abys |
| 2003/0010377 A1* | 1/2003 | Fukuda ............ H01L 31/048 136/251 |
| 2003/0180983 A1 | 9/2003 | Oswald |
| 2004/0261840 A1 | 12/2004 | Schmit |
| 2005/0039788 A1 | 2/2005 | Blieske |
| 2005/0268963 A1 | 12/2005 | Jordan |
| 2006/0048798 A1 | 3/2006 | McCoy |
| 2006/0086620 A1 | 4/2006 | Chase |
| 2006/0204730 A1 | 9/2006 | Nakamura |
| 2007/0011898 A1* | 1/2007 | Frank ............ E04F 21/0092 33/526 |
| 2008/0135085 A1 | 6/2008 | Corrales |
| 2008/0231768 A1* | 9/2008 | Okabe ............ G01J 1/42 349/25 |
| 2009/0101192 A1 | 4/2009 | Kothari |
| 2009/0120497 A1 | 5/2009 | Schetty |
| 2009/0133739 A1 | 5/2009 | Shiao |
| 2009/0133740 A1 | 5/2009 | Shiao |
| 2009/0233083 A1 | 9/2009 | Inoue |
| 2009/0242021 A1 | 10/2009 | Petkie |
| 2009/0287446 A1 | 11/2009 | Wang |
| 2009/0308435 A1 | 12/2009 | Caiger |
| 2010/0000603 A1 | 1/2010 | Tsuzuki |
| 2010/0006147 A1 | 1/2010 | Nakashima |
| 2010/0018568 A1 | 1/2010 | Nakata |
| 2010/0132762 A1 | 6/2010 | Graham |
| 2010/0147363 A1 | 6/2010 | Huang |
| 2010/0180929 A1 | 7/2010 | Raymond |
| 2011/0023937 A1 | 2/2011 | Daniel |
| 2011/0023942 A1 | 2/2011 | Soegding |
| 2011/0030761 A1 | 2/2011 | Kalkanoglu |
| 2011/0277825 A1 | 11/2011 | Fu |
| 2012/0012162 A1 | 1/2012 | Kobayashi |
| 2012/0031470 A1 | 2/2012 | Dimov |
| 2012/0048349 A1 | 3/2012 | Metin |
| 2012/0060911 A1 | 3/2012 | Fu |
| 2012/0125391 A1 | 5/2012 | Pinarbasi |
| 2012/0199184 A1 | 8/2012 | Nie |
| 2012/0237670 A1 | 9/2012 | Lim |
| 2013/0048062 A1 | 2/2013 | Min |
| 2013/0061913 A1 | 3/2013 | Willham |
| 2013/0160823 A1 | 6/2013 | Khouri |
| 2013/0206213 A1 | 8/2013 | He |
| 2013/0209776 A1 | 8/2013 | Kim |
| 2013/0233378 A1 | 9/2013 | Moslehi |
| 2013/0247959 A1 | 9/2013 | Kwon |
| 2013/0255755 A1 | 10/2013 | Chich |
| 2013/0280521 A1 | 10/2013 | Mori |
| 2014/0120699 A1 | 5/2014 | Hua |
| 2014/0124014 A1 | 5/2014 | Morad |
| 2014/0196768 A1 | 7/2014 | Beitel |
| 2014/0313574 A1 | 10/2014 | Bills |
| 2014/0360582 A1 | 12/2014 | Cui |
| 2015/0090314 A1 | 4/2015 | Yang |
| 2015/0155824 A1 | 6/2015 | Chien |
| 2015/0194552 A1 | 7/2015 | Ogasahara |
| 2015/0243931 A1 | 8/2015 | Fukuura |
| 2015/0270410 A1 | 9/2015 | Heng |
| 2015/0349145 A1 | 12/2015 | Morad |
| 2015/0349152 A1 | 12/2015 | Voss |
| 2015/0349703 A1 | 12/2015 | Morad |
| 2016/0013329 A1 | 1/2016 | Brophy |
| 2016/0105144 A1 | 4/2016 | Haynes |
| 2016/0163902 A1 | 6/2016 | Podlowski |
| 2016/0181446 A1 | 6/2016 | Kalkanoglu |
| 2016/0225931 A1 | 8/2016 | Heng |
| 2017/0033250 A1 | 2/2017 | Ballif |
| 2017/0077343 A1 | 3/2017 | Morad |
| 2017/0194516 A1 | 7/2017 | Reddy |
| 2017/0222082 A1 | 8/2017 | Lin |
| 2017/0358699 A1* | 12/2017 | Juliano ............ H01L 31/048 |
| 2018/0166601 A1 | 6/2018 | Inaba |

FOREIGN PATENT DOCUMENTS

| | | | |
|---|---|---|---|
| CN | 102956730 | 6/2016 | |
| DE | 102007054124 | 5/2009 | |
| EP | 1058320 | 12/2000 | |
| EP | 2051124 A2 | 4/2009 | |
| EP | 2709160 | 3/2014 | |
| GB | 2278618 | 12/1994 | |
| JP | S57141979 | 9/1982 | |
| JP | S6020586 | 2/1985 | |
| JP | H06140657 | 5/1994 | |
| JP | H06264571 | 9/1994 | |
| JP | 2000058894 A * | 2/2000 | ............ Y02E 10/50 |
| JP | 2000091610 | 3/2000 | |
| JP | 2000216415 | 8/2000 | |
| JP | 2013211385 | 10/2013 | |
| WO | 2008136872 | 11/2008 | |
| WO | WO-2008136872 A2 * | 11/2008 | ............ H02S 40/36 |
| WO | 2009062106 | 5/2009 | |
| WO | 2009099418 | 8/2009 | |
| WO | 2010128375 | 11/2010 | |
| WO | 2011128757 | 10/2011 | |
| WO | 201359441 | 4/2013 | |
| WO | 2013067541 | 5/2013 | |
| WO | 2013102181 | 7/2013 | |
| WO | 2014178180 | 11/2014 | |
| WO | 2015155356 | 10/2015 | |
| WO | 2016090341 | 6/2016 | |

OTHER PUBLICATIONS

Bulucani et al., "A new approach: low cost masking material and efficient copper metallization for higher efficiency silicon solar cells" 2015 IEEE.

Fan et al., "Laser micromachined wax-covered plastic paper as both sputter deposition shadow masks and deep-ultraviolet patterning masks for polymethylmacrylate-based microfluidic systems" via google scholar, downloaded Mar. 31, 2016.

"An inorganic/organic hybrid coating for low cost metal mounted dye-sensitized solar cells" Vyas, N. et al.

(56) References Cited

OTHER PUBLICATIONS

"Recovery Act: Organic Coatings as Encapsulants for Low Cost, High Performance PV Modules" Jim Poole et al. Nov. 16, 2011.
Pelisset: "Efficiency of Silicon Thin-Film photovoltaic Modules with a Front Coloured Glass", Preceedings CISBAT 2011, Jan. 1, 2011, pp. 37-42, XP055049695, the Whole Document.

\* cited by examiner

300

INTER-TILE SUPPORT FOR SOLAR ROOF TILES

BACKGROUND

Field

This disclosure is generally related to photovoltaic (or "PV") roof tiles. More specifically, this disclosure is related to a mechanical support and protection spacer for PV roof tiles.

RELATED ART

In residential and commercial solar energy installations, a building's roof typically is installed with photovoltaic (PV) modules, also called PV or solar panels, that can include a two-dimensional array (e.g., 6×12) of solar cells. A PV roof tile (or a solar roof tile) can be a particular type of PV module offering weather protection for the home and a pleasing aesthetic appearance, while also functioning as a PV module to convert solar energy to electricity. The PV roof tile can be shaped like a conventional roof tile and can include one or more solar cells encapsulated between a front cover and a back cover, but typically encloses fewer solar cells than a conventional solar panel. The front and back covers can be fortified glass or other material that can protect the PV cells from the weather elements. Note that a typical roof tile may have a dimension of 15 in×8 in =120 $in^2$=774 $cm^2$, and a typical solar cell may have a dimension of 6 in×6 in =36 $in^2$=232 $cm^2$. Similar to a conventional PV panel, the PV roof tile can include an encapsulating layer, such as an organic polymer. A lamination process can seal the solar cells between the front and back covers.

To facilitate scalable production and easy installation of PV roof tiles, a group of tiles can be fabricated together and jointed in a rigid or semi-rigid way. Carefully designed spacers inserted between adjacent tiles are needed to facilitate the jointing of adjacent PV roof tiles.

SUMMARY

One embodiment described herein provides a photovoltaic roof module. The roof module can include at least a first photovoltaic roof tile, a second photovoltaic roof tile positioned adjacent to the first photovoltaic roof tile, and a spacer coupled to and positioned between the first and second photovoltaic roof tiles. The spacer is configured to facilitate a semi-rigid joint between the first and second photovoltaic roof tiles.

In a variation on this embodiment, the spacer can be made of polyvinylidene fluoride (PVDF) or polytetrafluoroethylene (PTFE).

In a variation on this embodiment, each photovoltaic roof tile can include a front cover, a back cover, and encapsulant positioned between the front and the back covers.

In a further variation, the spacer can include a base and two wings extending from the base in opposite directions. A respective wing of the spacer can be embedded within the encapsulant positioned between the front and back covers of a respective photovoltaic roof tile.

In a further variation, the base of the spacer can include a groove extending along a longitudinal axis on its sun-facing surface, thereby creating a visual effect of a gap between the first and second photovoltaic roof tiles.

In a further variation, a length of a respective wing can be at least 3 mm.

In a further variation, the base can include a channel on its bottom surface configured to allow a metallic tab electrically coupling the first and second photovoltaic roof tiles to pass through.

In a further variation, a surface of the respective wing can be textured.

In a further variation, each photovoltaic roof tile comprises a cascaded string of photovoltaic structures embedded inside the encapsulant.

One embodiment described herein provides a system and method for fabricating a photovoltaic roof module. During operation, the system prepares first and second back covers, lays a first layer of encapsulant on the first and second back covers, and places first and second sets of photovoltaic structures on the first encapsulant layer. The first and second sets of photovoltaic structures are positioned above the first and second back covers, respectively. The system further places a reinforcement spacer between the first and second sets of photovoltaic structures. The reinforcement spacer comprises a base and first and second wings extending from the base in opposite directions, and the first and second wings are positioned above the first layer of encapsulant and above, respectively, the first and second back covers. Subsequently, the system places a second layer of encapsulant and places first and second front covers over the second layer of encapsulant, the first and second front covers being positioned above the first and second back covers, respectively. Finally, the system performs a lamination operation.

One embodiment described herein provides a reinforcement spacer for providing bonding and structural support to adjacent photovoltaic roof tiles within a photovoltaic roof module. The spacer can include a base positioned between the adjacent photovoltaic roof tiles and first and second wings extending from the base in opposite directions. A respective wing is embedded within encapsulant positioned between front and back covers of a respective photovoltaic roof tile.

A "solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A photovoltaic structure may be divided into a number of strips. A strip may have any shape and any size. The width and length of a strip may be the same or different from each other. Strips may be formed by further dividing a previously divided strip.

"Finger lines," "finger electrodes," and "fingers" refer to elongated, electrically conductive (e.g., metallic) electrodes of a photovoltaic structure for collecting carriers.

"Busbar," "bus line," "bussing," or "bus electrode" refer to elongated, electrically conductive (e.g., metallic) electrodes of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a polycrystalline silicon-based solar cell, or a strip thereof.

BRIEF DESCRIPTION OF THE FIGURES

In the figures, like reference numerals refer to the same figure elements.

DETAILED DESCRIPTION

Figure 1:
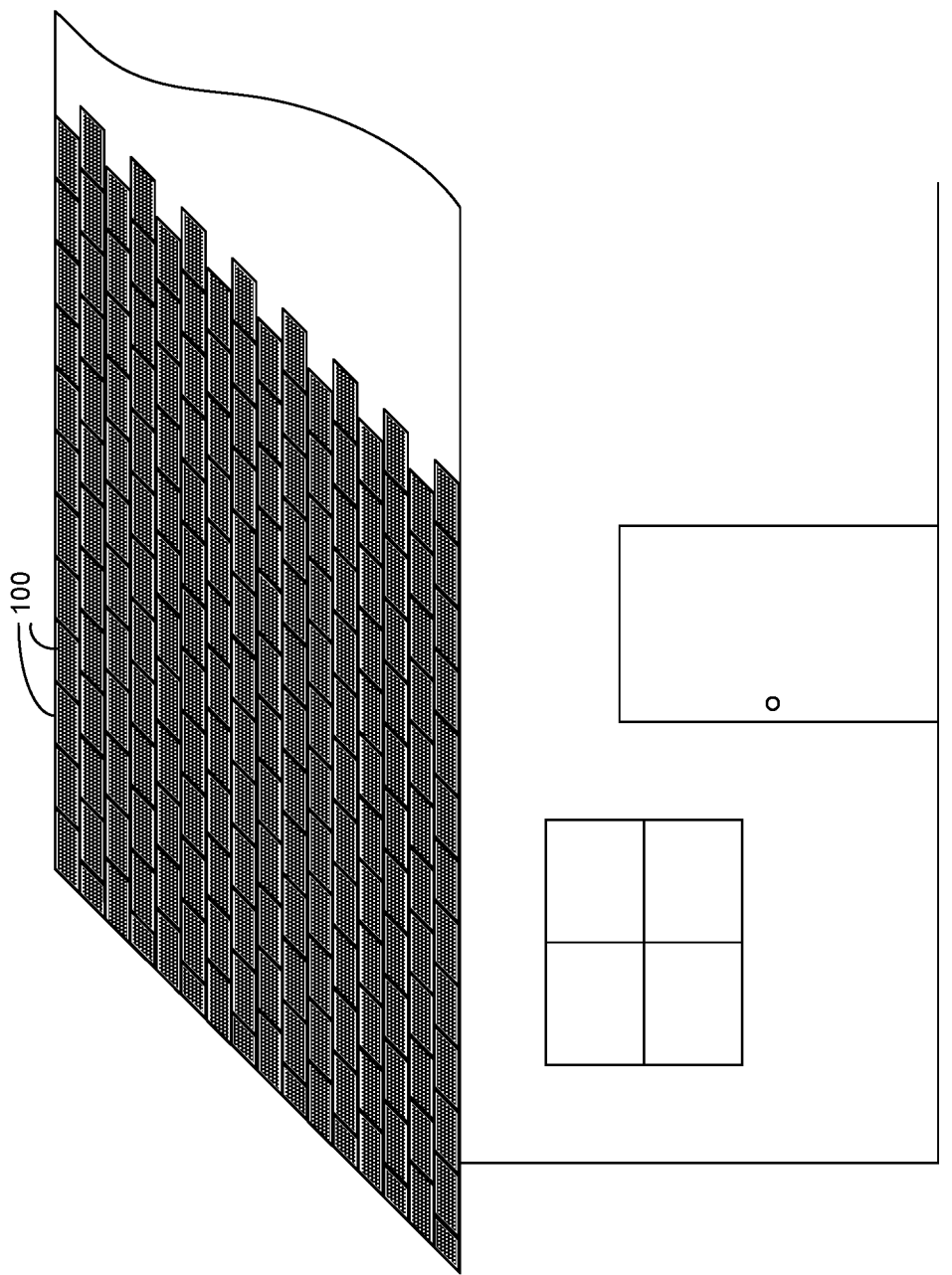
FIG. 1 shows an exemplary configuration of photovoltaic roof tiles on a house.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the disclosed system is not limited to the embodiments shown, but is to be accorded the widest scope consistent with the principles and features disclosed herein.

Overview

Embodiments provide a solution to the problem of providing mechanical support to one or more pairs of photovoltaic (PV) roof tiles in a multi-tile group, by including a reinforcement spacer beam. In addition to providing mechanical support, the spacer beam can facilitate inter-tile electrical connections and protect the electrical bussing wires/tabs from the weather elements. Moreover, the spacer beams can play an important role during the manufacturing of the multi-tile modules. For example, they can assist in aligning of the multiple glass covers in a module, and limit and direct the flow of encapsulant during lamination. Carefully designed spacers can also improve the visual appearance of the multi-tile module. In general, the reinforcement spacer beams can enhance structural integrity during manufacturing, installation, and service.

Prefabricating individual PV tiles into multi-tile modules can considerably simplify the roofing process, since the tiles within the module have been electrically and mechanically connected at the time of manufacture. By improving the resilience, stability, and weather protection offered by the inter-tile spacers, the disclosed spacers improve the tiles' capacity to function jointly as a group.

The spacer beam can include a base (or base ridge) and two stability wings. The spacer can be positioned with its base ridge between two adjacent PV roof tiles, with the base ridge's long axis parallel to the tiles' edges. The two wings can be separately inserted between the glass covers of the two PV roof tiles, mechanically coupling the two roof tiles to the spacer beam. The base ridge can further include a groove on its top surface to provide a visual appearance of a gap between the two roof tiles, and a bottom channel to facilitate electrical connections between the two PV roof tiles.

PV Modules and Roof Tiles

One main function provided by the inter-tile spacer is mechanical support to a pair of photovoltaic (PV) roof tiles within a multi-tile module. A PV roof tile (or solar roof tile) is a type of PV module shaped like a roof tile and typically enclosing fewer solar cells than a conventional solar panel. Note that such PV roof tiles can function as both PV cells and roof tiles at the same time. PV roof tiles and modules are described in more detail in U.S. Provisional Patent Application No. 62/465,694, entitled "SYSTEM AND METHOD FOR PACKAGING PHOTOVOLTAIC ROOF TILES" filed Mar. 1, 2017, which is incorporated herein by reference. In some embodiments, the system disclosed herein can be applied to PV roof tiles and/or other types of PV module.

FIG. 1 shows an exemplary configuration of PV roof tiles on a house. PV roof tiles 100 can be installed on a house like conventional roof tiles or shingles. Particularly, a PV roof tile can be placed with other tiles in such a way as to prevent water from entering the building.

A PV roof tile can enclose multiple solar cells or PV structures, and a respective PV structure can include one or more electrodes such as busbars and finger lines. The PV structures within a PV roof tile can be electrically and optionally mechanically coupled to each other. For example, multiple PV structures can be electrically coupled together by a metallic tab, via their respective busbars, to create serial or parallel connections. Moreover, electrical connections can be made between two adjacent tiles, so that a number of PV roof tiles can jointly provide electrical power.

Figure 2:
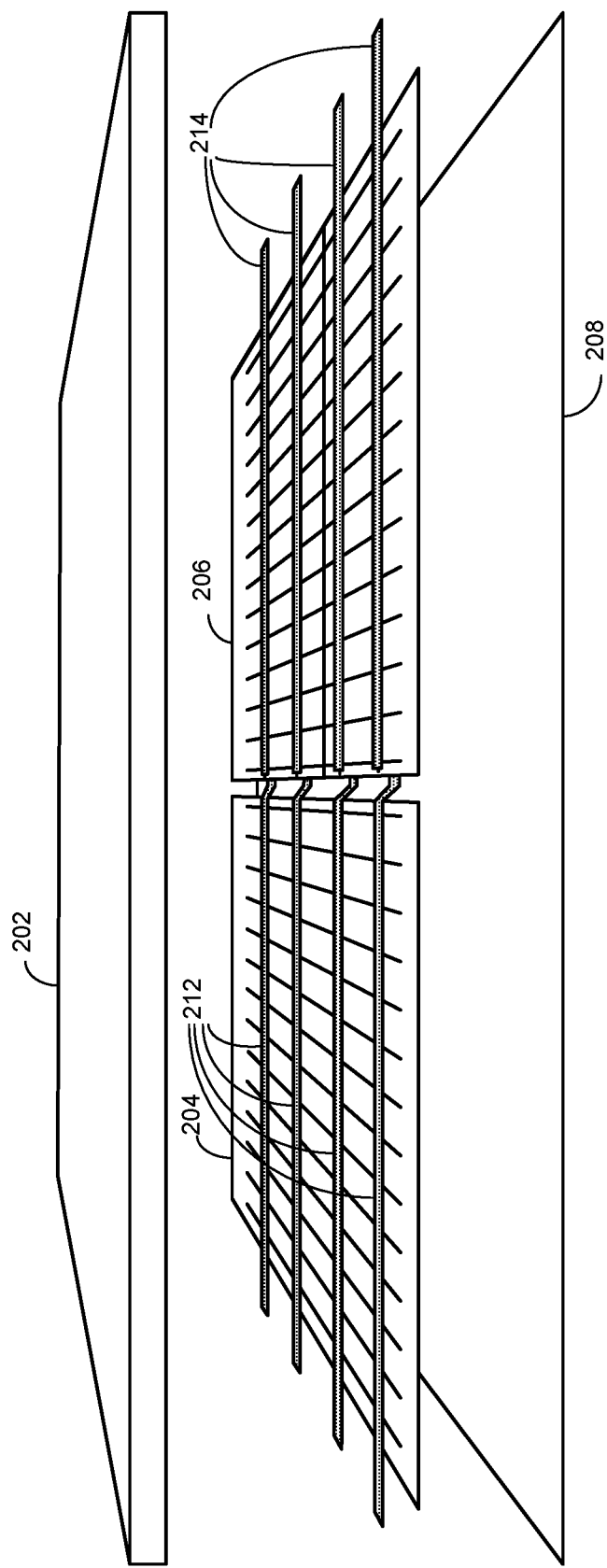
FIG. 2 shows the perspective view of an exemplary photovoltaic roof tile, according to an embodiment.

FIG. 2 shows the perspective view of an exemplary photovoltaic roof tile, according to an embodiment. Solar cells 204 and 206 can be hermetically sealed between top glass cover 202 and backsheet 208, which jointly can protect the solar cells from various weather elements. In the example shown in FIG. 2, metallic tabbing strips 212 can be in contact with the front-side electrodes of solar cell 204 and extend beyond the left edge of glass 202, thereby serving as contact electrodes of a first polarity of the PV roof tile. Tabbing strips 212 can also be in contact with the back side of solar cell 206, creating a serial connection between solar cell 204 and solar cell 206. On the other hand, tabbing strips 214 can be in contact with front-side electrodes of solar cell 206 and extend beyond the right-side edge of glass cover 202, serving as contact electrodes of a second polarity of the PV roof tile.

The tabbing strips can ensure sufficient electrical contact, thereby reducing the likelihood of detachment. Furthermore, the multiple (e.g., four) tabbing strips being sealed between glass cover 202 and backsheet 208 can improve the durability of the PV roof tile.

Figure 3:
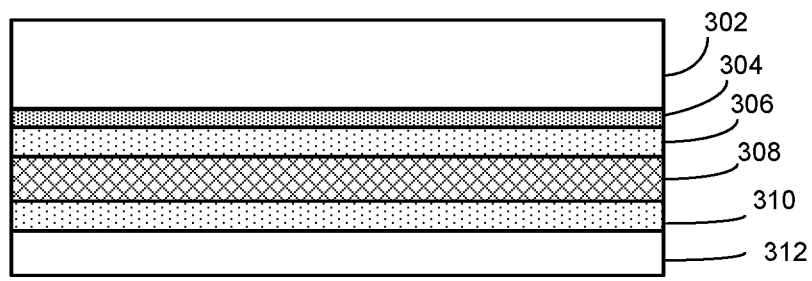
FIG. 3 shows a cross-section of an exemplary photovoltaic roof tile, according to an embodiment.

FIG. 3 shows a cross-section of an exemplary photovoltaic roof tile, according to an embodiment. Solar cell or array of solar cells 308 can be encapsulated between top glass cover 302 and back cover 312, which can be glass or regular PV backsheet. Top encapsulant layer 306, which can be based on a polymer, can be used to seal between top glass cover 302 and solar cell or array of solar cells 308. Specifically, encapsulant layer 306 may include polyvinyl butyral (PVB), thermoplastic polyolefin (TPO), ethylene vinyl acetate (EVA), or N,N'-diphenyl-N,N'-bis(3-methylphenyl)-1,1'-diphenyl-4,4'-diamine (TPD). Similarly, lower encapsulant layer 310, which can be based on a similar material, can be used to seal between array of solar cells 308 and back cover 312. A PV roof tile can also contain other optional layers, such as an optical filter or coating layer or a layer of nanoparticles for providing desired color appearances. In the example of FIG. 3, module or roof tile 300 also contains an optical filter layer 304.

Multi-Unit Groups of PV Roof Tiles

Figure 4A:
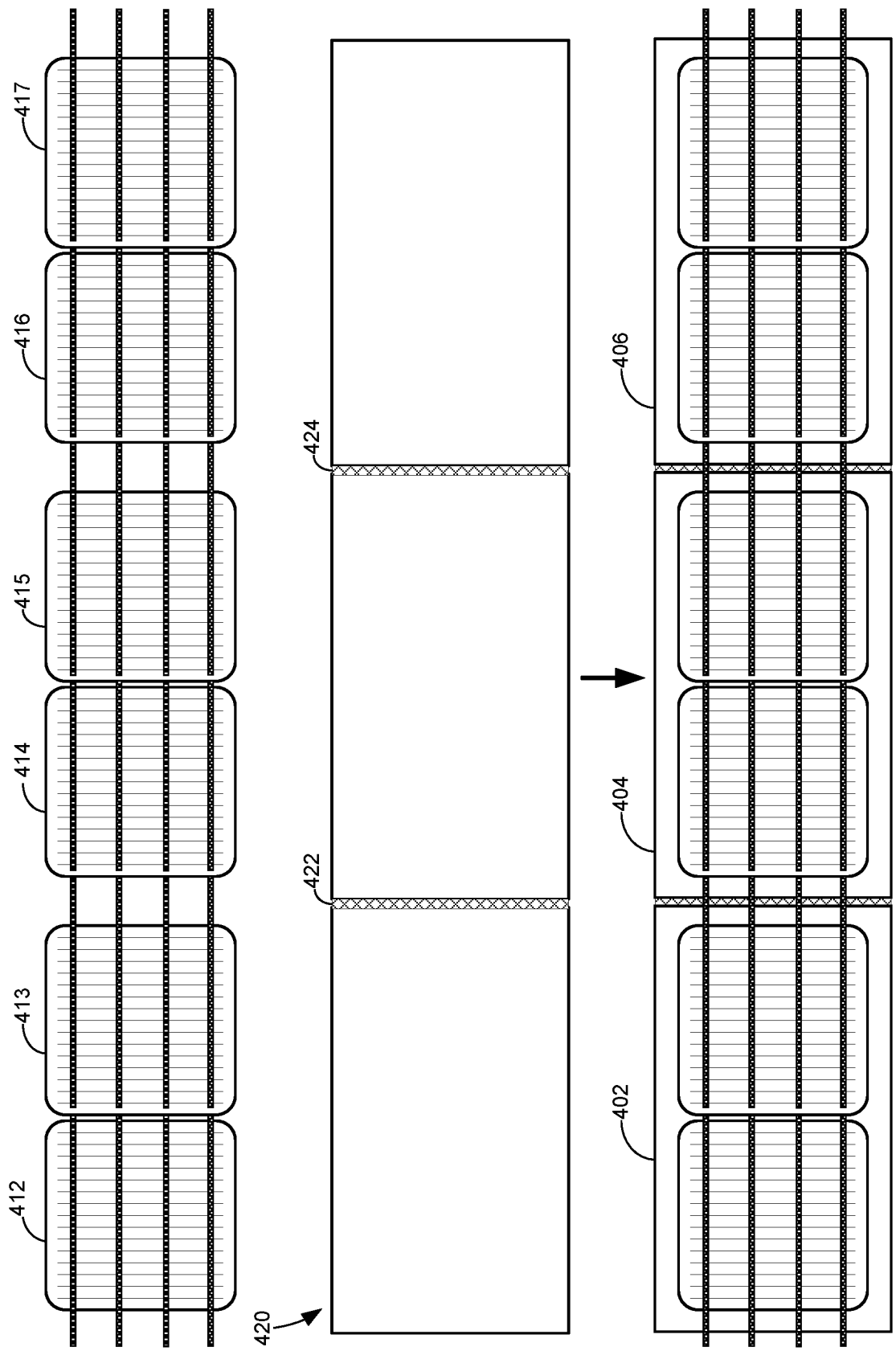
FIG. 4A illustrates an exemplary configuration of a multi-tile module, according to one embodiment.

To facilitate more scalable production and easier installation, multiple photovoltaic roof tiles can be fabricated together, while the tiles are linked in a rigid or semi-rigid way. FIG. 4A illustrates an exemplary configuration of a multi-tile module, according to one embodiment. In this example, three PV roof tiles 402, 404, and 406 can be manufactured together. During fabrication, solar cells 412 and 413 (corresponding to tile 402), 414 and 415 (corresponding to tile 404), and 416 and 417 (corresponding to tile 406) can be laid out with tabbing strips interconnecting their corresponding busbars, forming a connection in series. Furthermore, these six solar cells can be laid out on a common backsheet. Subsequently, front-side glass cover 420 can be sealed onto these six PV cells.

It is possible to use a single piece of glass as glass cover 420. In one embodiment, grooves 422 and 424 can be made on glass cover 420, so that the appearance of three separate roof tiles can be achieved. It is also possible to use three separate pieces of glass to cover the six cells, which are laid out on a common back sheet. In this case, gaps 422 and 424 can be sealed with an encapsulant material, establishing a semi-rigid coupling between adjacent tiles. Prefabricating multiple tiles into a rigid or semi-rigid multi-tile module can significantly reduce the complexity of roof installation, because the tiles within the module have been connected with the tabbing strips. Note that the numbers of tiles included in each multi-tile module can be more or fewer than what is shown in FIG. 4A.

Figure 4B:
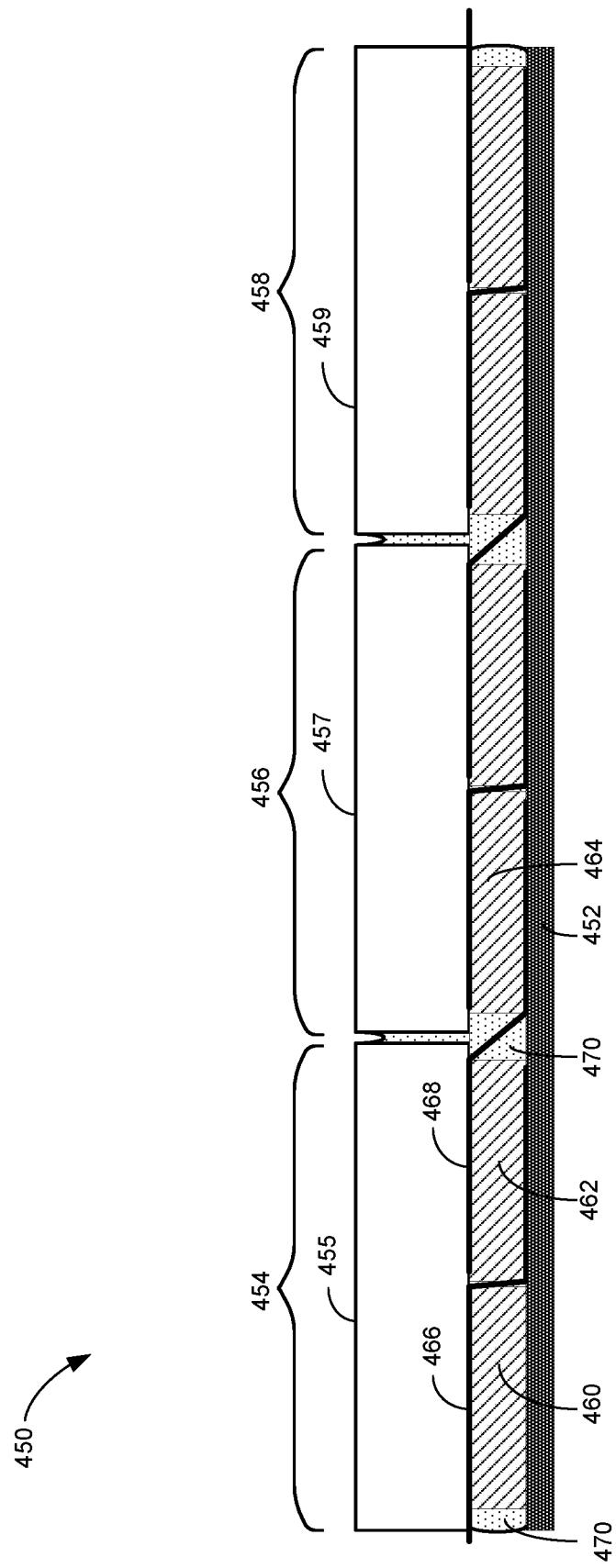
FIG. 4B illustrates a cross-section of an exemplary multi-tile module, according to one embodiment.

FIG. 4B illustrates a cross-section of an exemplary multi-tile module, according to one embodiment. In this example, multi-tile module 450 can include photovoltaic roof tiles 454, 456, and 458. These tiles can share common backsheet 452, and have three individual glass covers 455, 457, and 459, respectively. Each tile can encapsulate two solar cells.

For example, tile 454 can include solar cells 460 and 462 encapsulated between backsheet 452 and glass cover 455. Tabbing strips can be used to provide electrical coupling within each tile and between adjacent tiles. For example, tabbing strip 466 can couple the front electrode of solar cell 460 to the back electrode of solar cell 462, creating a serial connection between these two cells. Similarly, tabbing strip 468 can couple the front electrode of cell 462 to the back electrode of cell 464, creating a serial connection between tile 454 and tile 456.

The gap between two adjacent PV tiles can be filled with encapsulant, protecting tabbing strips interconnecting the two adjacent tiles from the weather elements. For example, encapsulant 470 fills the gap between tiles 454 and 456, protecting tabbing strip 468 from weather elements. Furthermore, the three glass covers, backsheet 452, and the encapsulant together form a semi-rigid construction for multi-tile module 450. This semi-rigid construction can facilitate easier installation while providing a certain degree of flexibility among the tiles.

In addition to the examples shown in FIGS. 4A and 4B, a PV tile may include different forms of photovoltaic structures. For example, in order to reduce internal resistance, each solar cell shown in FIG. 4A can be divided into multiple (e.g., three) smaller strips, each having edge busbars of different polarities on its two opposite edges. The edge busbars allow the strips to be cascaded one by one to form a serially connected string.

Figure 4C:
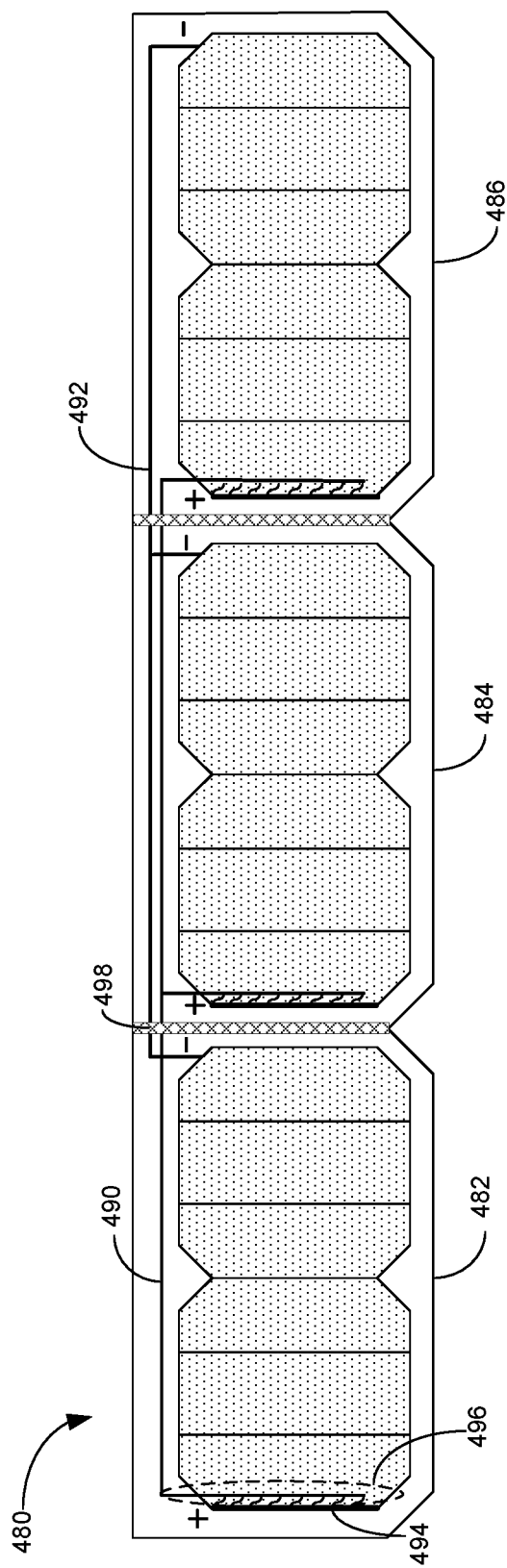
FIG. 4C shows the top view of an exemplary multi-tile module, according to one embodiment.

FIG. 4C shows the top view of an exemplary multi-tile module, according to one embodiment. Multi-tile module 480 can include PV roof tiles 482, 484, and 486 arranged side by side. Each PV roof tile can include six cascaded strips encapsulated between the front and back covers, meaning that busbars located at opposite edges of the cascaded string of strips have opposite polarities. For example, if the leftmost edge busbar of the strips in PV roof tile 482 has a positive polarity, then the rightmost edge busbar of the strips will have a negative polarity. Serial connections can be established among the tiles by electrically coupling busbars having opposite polarities, whereas parallel connections can be established among the tiles by electrically coupling busbars having the same polarity.

In the example shown in FIG. 4C, the PV roof tiles are arranged in such a way that their sun-facing sides have the same electrical polarity. As a result, the edge busbars of the same polarity will be on the same left or right edge. For example, the leftmost edge busbar of all PV roof tiles can have a positive polarity and the rightmost edge busbar of all PV roof tiles can have a negative polarity, or vice versa. In FIG. 4C, the left edge busbars of all strips have a positive polarity (indicated by the "+" signs) and are located on the sun-facing (or front) surface of the strips, whereas the right edge busbars of all strips have a negative polarity (indicated by the "−" signs) and are located on the back surface. Depending on the design of the layer structure of the solar cell, the polarity and location of the edge busbars can be different from those shown in FIG. 4C.

A parallel connection among the tiles can be formed by electrically coupling all leftmost busbars together via metal tab 490 and all rightmost busbars together via metal tab 492. Metal tabs 490 and 492 are also known as connection buses and typically can be used for interconnecting individual solar cells or strings. A metal tab can be stamped, cut, or otherwise formed from conductive material, such as copper. Copper is a highly conductive and relatively low cost connector material. However, other conductive materials such as silver, gold, or aluminum can be used. In particular, silver or gold can be used as a coating material to prevent oxidation of copper or aluminum. In some embodiments, alloys that have been heat treated to have super-elastic properties can be used for all or part of the metal tab. Suitable alloys may include, for example, copper-zinc-aluminum (CuZnAl), copper-aluminum-nickel (CuAlNi), or copper-aluminum-beryllium (CuAlBe). In addition, the material of the metal tabs disclosed herein can be manipulated in whole or in part to alter mechanical properties. For example, all or part of metal tabs 490 and 492 can be forged (e.g., to increase strength), annealed (e.g., to increase ductility), and/or tempered (e.g. to increase surface hardness).

The coupling between a metal tab and a busbar can be facilitated by a specially designed strain-relief connector. In FIG. 4C, strain-relief connector 496 can be used to couple busbar 494 and metal tab 490. Such strain-relief connectors are needed due to the mismatch of the thermal expansion coefficients between metal (e.g., Cu) and silicon. As shown in FIG. 4C, the metal tabs (e.g., tabs 490 and 492) may cross paths with strain-relief connectors of opposite polarities. To prevent an electrical short of the photovoltaic strips, portions of the metal tabs and/or strain-relief connectors can be coated with an insulation film or wrapped with a sheet of insulation material.

Similar to the examples shown in FIGS. 4A and 4B, the gaps between adjacent tiles can be filled with encapsulant to form a semi-rigid joint between the adjacent tiles.

There remain several problems with the semi-rigid construction of multi-tile modules. Particularly, the inter-tile gap filled with encapsulant may be a structurally weak spot, providing insufficient flexibility and strength for reliable long-term usage. In addition, it can be difficult to deposit the encapsulant material precisely at the gaps. For example, encapsulant may overflow the gap during the lamination process, and be difficult to clean. Aesthetically, the encapsulant-filled gap can be ungainly, and appear noticeably different from standard roof tiles. Finally, weather elements such as rain and solar radiation can damage PV components, especially if there are exposed electrical connections.

Figure 5:
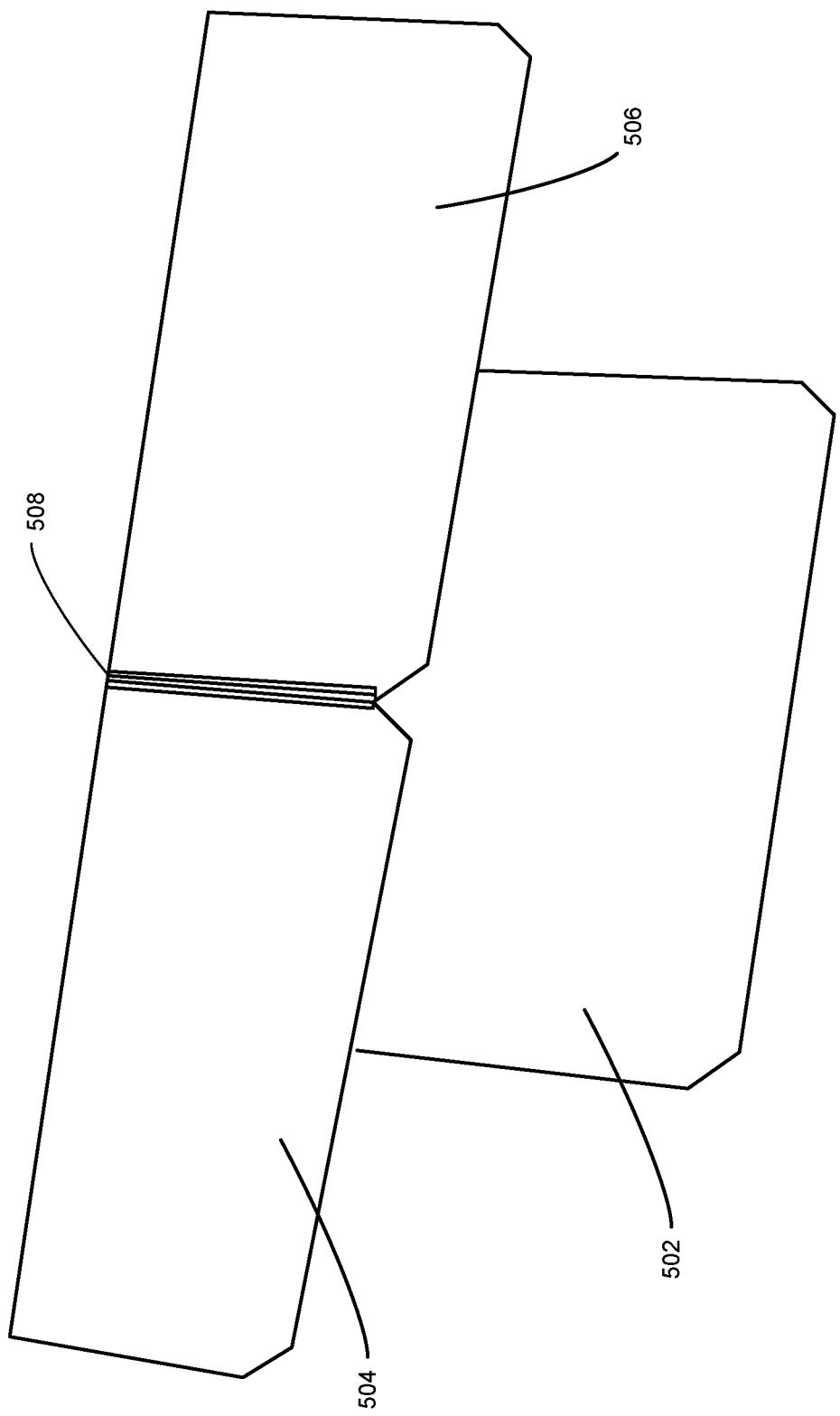
FIG. 5 illustrates multiple photovoltaic roof tiles installed in an overlapping configuration, according to an embodiment.

Some embodiments can solve these problems by providing a reinforcement spacer to enhance flexibility and mechanical stability of a multi-tile module. In addition, the reinforcement spacer can protect inter-tile electrical bussing and direct/control the flow of encapsulant during lamination. FIG. 5 illustrates multiple photovoltaic roof tiles installed in an overlapping configuration, according to an embodiment. In FIG. 5, PV roof tiles 504 and 506 are coupled side-by-side by reinforcement spacer 508. PV roof tiles 504 and 506 overlap with PV roof tile 502 in an offset manner such that the gap between tiles 504 and 506, and therefore reinforcement spacer 508, are somewhat aligned to the center of PV roof tile 502. This arrangement can prevent possible water leakage through the gap between tiles 504 and 506.

As will be described below, the reinforcement spacer (e.g., spacer 508) not only can enable mechanical coupling that offers both strength and flexibility, but also can facilitate and protect inter-tile electrical bussing. Moreover, the spacer can improve the aesthetic appearance and encapsulant utilization of the inter-tile spaces. Thus, a prefabricated multi-tile module that incorporates one or more reinforcement spacers can offer weather protection for the home, solar energy conversion, expedient installation, mechanical stability and flexibility, protection and insulation of electrical connections, encapsulant flow control, and an aesthetic appearance similar to conventional roof tiles.

Reinforcement Spacer

Figure 6A:
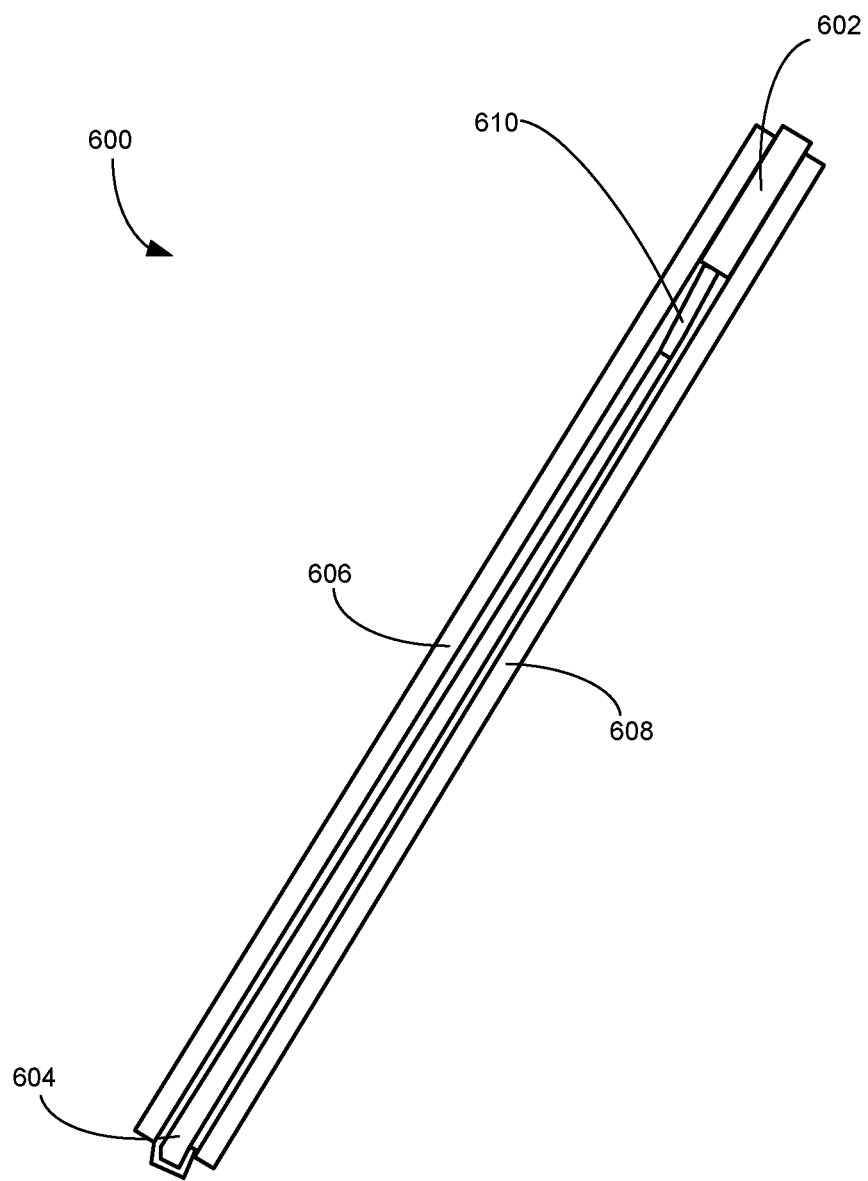
FIG. 6A illustrates a perspective view of an exemplary reinforcement spacer, according to an embodiment.

FIG. 6A illustrates a perspective view of an exemplary reinforcement spacer, according to an embodiment. A spacer can be designed to fit between two adjacent PV roof tiles in a multi-tile module, as shown in FIG. 5. In FIG. 6A, spacer 600 includes a main body (can be referred to a base or base ridge) 602 that can be inserted between the adjacent PV roof tiles. When in position, base 602 can be arranged in such a way that its longitudinal axis is oriented parallel to the adjacent edges of the tiles. The thickness of base 602 can be designed in such a way that, when in position, the top or sun-facing surface of base 602 can be aligned with the surface of the top glass cover of the PV tiles, thus creating a seamless interface between base 602 and the PV tiles. Base 602 can include a groove 604 on its top surface. Such a groove is essential in providing a visual appearance of a gap existing between the adjacent PV roof tiles. As discussed previously, the PV roof tiles are designed to mimic the appearance of traditional roof tiles. In the example shown in FIG. 6A, the cross-section of groove 604 can shape U-shaped, with square corners. Alternatively, the cross-section of the groove can be U-shape, with round corners. Groove 604 can also have other types of cross-section, such as a V-shape cross-section or a trapezoidal cross-section. The depth of groove 604 can vary as long as it is sufficiently thick to be able to create the visual effect of a gap.

In some embodiments, instead of a groove, the visual effect of a "gap" can be created by a mark (e.g., a painted mark or a color variation) created on the top surface of base 602. Such a mark can generally provide a neater or more attractive aesthetic appearance compared with an encapsulant-filled inter-tile gap.

Spacer 600 can have two wings 606 and 608 attached to either side of base 602. The position and thickness of each wing are designed in such a way that, when in position, the wings can be inserted into the adjacent roof tiles. More specifically, each wing can be inserted between the top glass cover and backsheet of a corresponding roof tile. Therefore, after lamination, each PV tile can be mechanically bound to a wing, thus creating a rigid or semi-rigid bonding between the two adjacent PV tiles. More specifically, a rigid spacer can provide a rigid bonding, whereas a somewhat flexible spacer can provide a somewhat flexible or semi-rigid bonding. In practice, it can be desirable for the inter-tile bonding to be somewhat flexible in order to accommodate certain conditions, such as windy days.

In the example shown in FIG. 6A, the wings can be rectangular and extend perpendicularly from the walls of groove 604. Other shapes are possible. For example, the wings may have a tapered thickness. The length of the wings can vary. Longer wings can provide a stronger bond and a greater flexibility. In particular, longer wings provide greater adhesion to the glass and backsheet, and can allow the spacer to bend at a greater angle without detaching from the roof tiles. However, longer wings can occupy too much tile space and may shrink more upon cooling after lamination, leaving "bubbles" or space unfilled by the lamination. In some embodiments, the length of the wings can be chosen to provide enough flexibility for bending by an angle of up to 5° or 10°. For example, the length of the wings can be at least 3 mm (e.g., between 3 and 5 mm). In some embodiments, the length of the wings can be between 10 mm and 20 mm. A spacer with 20 mm wings can allow adjacent PV roof tiles to be offset from each other by 90°. The thickness of the wings can also vary, as long as sufficient structure strength of spacer 600 can be achieved, while allowing sufficient amount of encapsulant to flow between the wings and the front and back covers of the PV tiles.

Likewise, the choice of material is important to the strength, performance, and long-term reliability of spacer 600. Because PV roof tiles are exposed to the sun and other weather elements (e.g., rain and snow), spacer 600 needs to be made of material that is ultraviolet (UV)-resistant as well as waterproof. Moreover, because it can be in contact with the inter-tile electrical connections, spacer 600 should be made of a material that is electrically insulating. The material also ideally can withstand the heating, cooling, and associated thermal expansion resulting from lamination. In particular, the material preferably will not thermally contract excessively when cooling after lamination. In an embodiment, spacer 600 can be made from a polymer or thermoplastic material, such as polyvinylidene fluoride (PVDF). Note that other materials are possible (e.g., polytetrafluoroethylene (PTFE)). In alternative embodiments, spacer 600 can be made of a soft material, such as silicone.

One important function provided by spacer 600 is to protect the inter-tile electrical bussing against weather elements such as rain, wind, or dirt. Note that, when driven by wind, rainwater can travel upwards along a roof. Because the PV roof tiles are typically laid in a way such that one row of tiles offsets an adjacent row of tiles, as shown in FIGS. 1 and 5, ramp 610 can be used at the top of spacer 600 to prevent rainwater from getting under the tiles of the upper row or being accumulated within groove 604.

Figure 6B:
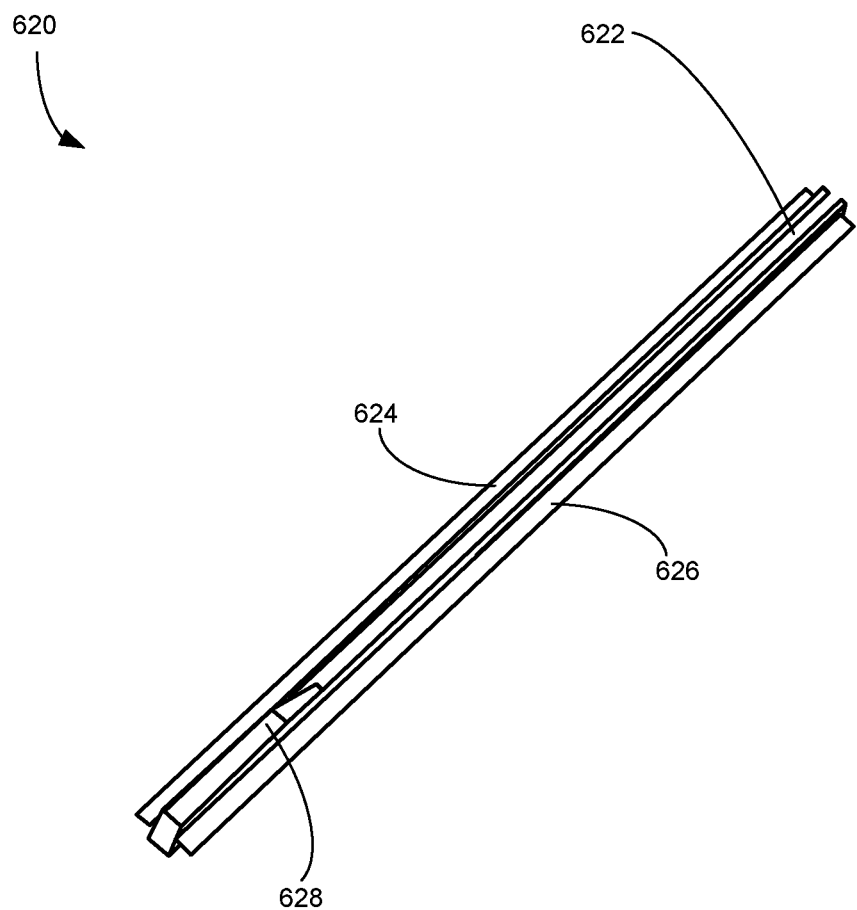
FIG. 6B illustrates an angled view of an exemplary reinforcement spacer, according to an embodiment.

FIG. 6B illustrates an angled view of an exemplary reinforcement spacer, according to an embodiment. In this example, spacer 620 can include top groove 622, wings 624 and 626, and ramp 628. As shown, ramp 628 can include an inclined portion rising from the bottom of groove 622 to a flat plateau, which can be level with the top of the walls of groove 622.

Figure 6C:
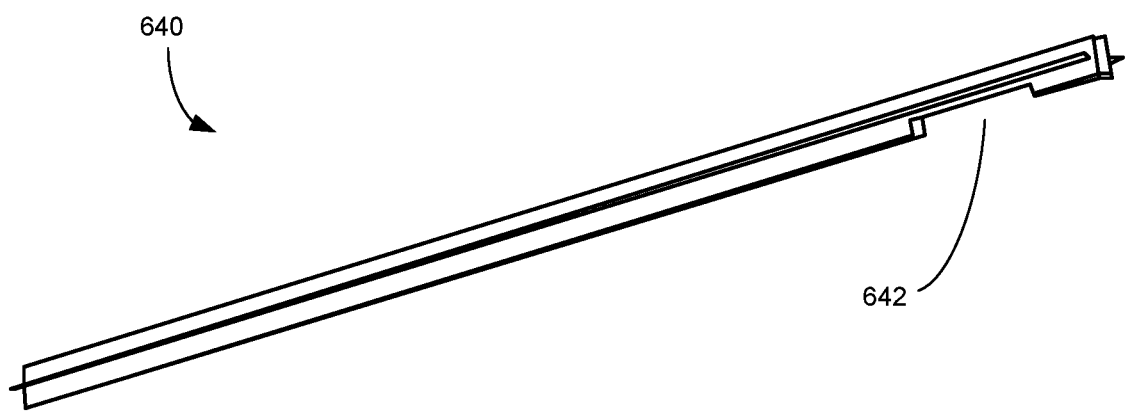
FIG. 6C illustrates another view of an exemplary reinforcement spacer, according to an embodiment.

FIG. 6C illustrates another view of an exemplary reinforcement spacer, according to an embodiment. More specifically, this view reveals the bottom half of the base of the spacer. In this example, the base of spacer 640 can include a recessed space or bottom channel 642 configured to allow electrical connecting mechanisms (e.g., bussing wires, ribbons, metal foil, or tabbing strips) to cross the inter-tile gap. Bottom channel 642 can be positioned opposite to the spacer's ramp, e.g. opposite to ramp 628 shown in FIG. 6B.

Figure 6D:
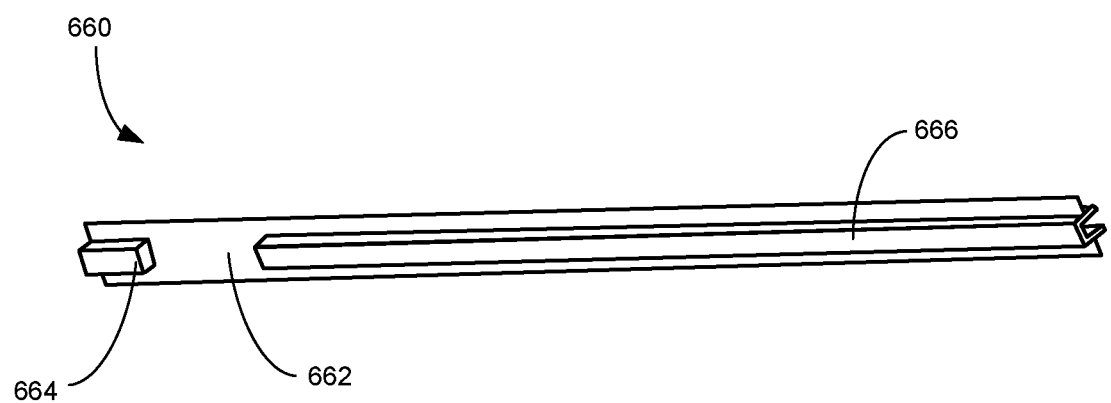
FIG. 6D illustrates one more view of an exemplary reinforcement spacer, according to an embodiment.

FIG. 6D illustrates one more view of an exemplary reinforcement spacer, according to an embodiment. In FIG. 6D, the bottom half of the spacer is shown with more details. More specifically, FIG. 6D shows that the bottom half of the base of spacer 660 can include a bottom channel 662 and a bottom anchoring panel 664, which can anchor spacer 660 between the two adjacent PV tiles. The remaining section of the base bottom is, in fact, the lower side walls and bottom wall of groove 666. In some embodiments, the side walls and bottom surface of anchoring panel 664 can be aligned to the outer side walls and bottom surface, respectively, of groove 666.

The channel at the bottom side of the spacer base can be essential in facilitating inter-tile electrical connections. More specifically, tabbing strips (e.g., metallic tabs 490 and 492 shown in FIG. 4C) can cross the spacer via the channel from one tile to an adjacent tile. The length of the channel can be determined based on the need of the electrical routing. Depending on the width and/or number of metallic tabs used for the inter-tile electrical coupling, the channel can be designed to be wider or narrower to accommodate the passing of such metallic tabs.

Figure 7B:
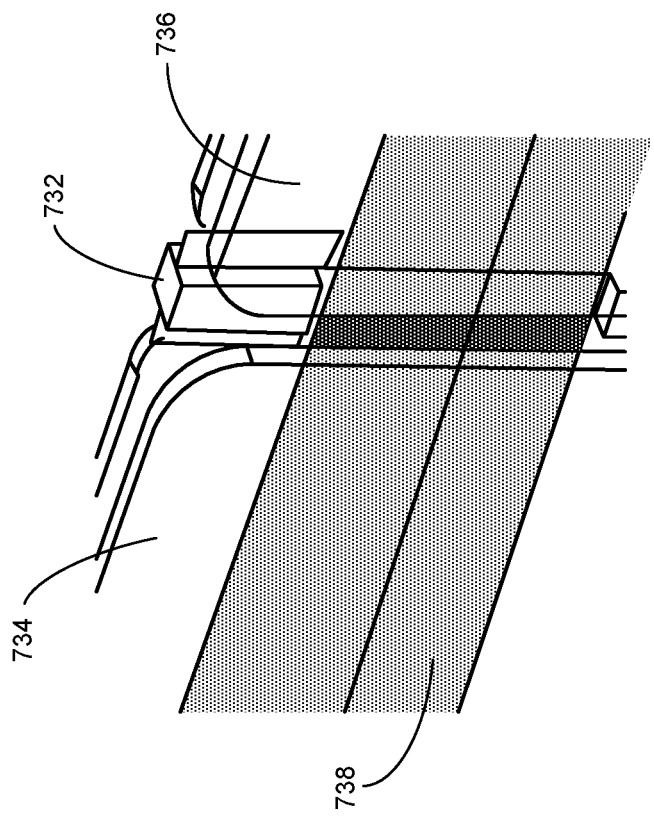
FIG. 7B illustrates a bottom view of a reinforcement spacer positioned between two adjacent photovoltaic roof tiles, according to an embodiment.
Figure 7A:
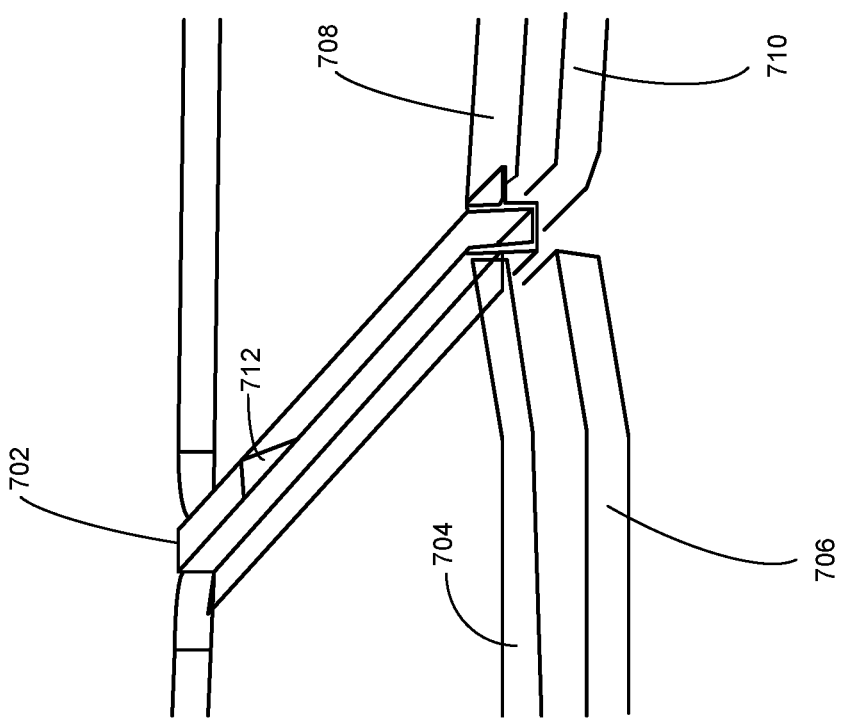
FIG. 7A shows an exemplary reinforcement spacer positioned between two adjacent photovoltaic roof tiles, according to an embodiment.

FIG. 7A shows an exemplary reinforcement spacer positioned between two adjacent photovoltaic roof tiles, according to an embodiment. This view shows a perspective from above the roof, i.e., the roof tiles' glass covers 704 and 708 face upward. In FIG. 7A, spacer 702 is positioned between glass covers 704 and 708 of two adjacent PV roof tiles, and can be oriented in such a way that, when installed on a roof, ramp 712 is positioned at the upper edge of the roof tiles closest to the roof's apex, i.e., ramp 712 is at the highest end of the spacer. As shown, the left wing of spacer 702 can be inserted between glass cover 704 and backsheet 706 of the left PV tile, and the right wing can be inserted between glass cover 708 and backsheet 710 of the right roof tile. For purposes of illustration, a space is drawn between a glass cover and a corresponding backsheet. In practice, after lamination, the glass cover and the corresponding backsheet can be bonded by encapsulant, which can also bind the wings of spacer 702 to the corresponding glass cover and backsheet. For example, the left wing of spacer 702 can be bonded, by cured encapsulant, to glass cover 704 and backsheet 706, and the right wing of spacer 702 can be bonded to glass cover 708 and backsheet 710. Note that, in some embodiments, two or more adjacent roof tiles can share a common backsheet, i.e., backsheets 706 and 710 can be joined together. In this case, the spacer's wings can be inserted between the respective glass covers and the common backsheet of the two adjacent PV roof tiles. The strong adhesion between the spacer's wings and the glass cover/backsheet can provide the strength to the entire multi-tile assembly to allow the multi-tile assembly to be handled as a single piece. However, severe bending between the tiles may result in the failing of the adhesion, and thus, the failing of the multi-tile assembly.

FIG. 7B illustrates a bottom view of a reinforcement spacer positioned between two adjacent photovoltaic roof tiles, according to an embodiment. As shown, electrical connections such as metallic tab or tabs 738 can extend across the bottom channel of spacer 732, electrically coupling roof tiles 734 and 736. In addition to metallic tabs, other types of electrically coupling mechanisms (e.g., tabbing strips, foils, folded bussing, and "o" or "n" shaped bussing) can also be used to electrically couple two adjacent PV tiles. In various embodiments, the roof tiles can be electrically coupled in series or in parallel.

Note that, because the bottom of the spacer faces inward toward the building, and because electrical connections (e.g., metallic tabs) elsewhere have been protected by encapsulant, it is possible to leave the electrical connections uninsulated within the bottom channel of the spacer. Laminating the bottom side of the inter-tile gap with encapsulant can be technically challenging to achieve a consistent coated thickness. To further protect the metallic tabs, in some embodiments, the bottom channel of the spacer can be covered by an additional plastic (e.g., PVDF or PTFE) piece.

Figure 7C:
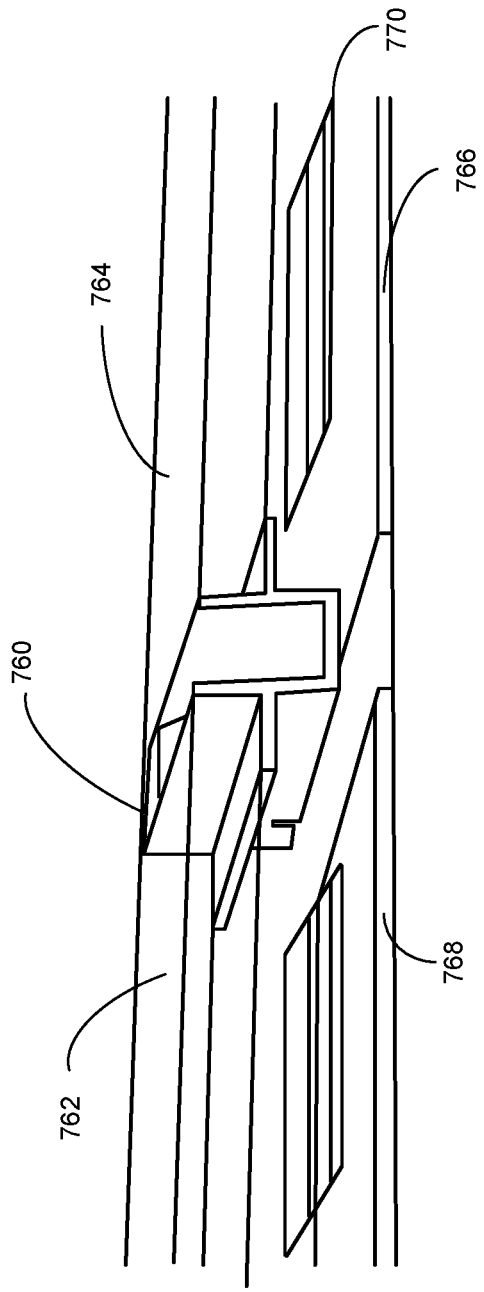
FIG. 7C illustrates a front view of a reinforcement spacer positioned between two adjacent photovoltaic roof tiles, according to an embodiment.

FIG. 7C illustrates a front view of a reinforcement spacer positioned between two adjacent photovoltaic roof tiles, according to an embodiment. The base of spacer 760 can be inserted between front glass covers 762 and 764 belonging to two adjacent PV tiles. In the example shown in FIG. 7C, the outer sidewalls of spacer 760 can be in direct contact with the edges of the two glass covers.

The top surface of spacer 760 can be positioned in the same plane as the top surface of the front glass covers. In some embodiments, after lamination, the bottom surface of spacer 760 can be aligned to the bottom surface of the backsheets. For illustration purposes, in FIG. 7C, backsheets 766 and 768 are shown to be separated from the spacer and top glass covers. In practice, after lamination, backsheets 766 and 768 can be attached to the wings of spacer 760 as well as the corresponding front glass covers. In FIG. 7C, backsheets 766 and 768 are shown to be separate. However, in various embodiments, the multiple roof tiles in the module can share a common backsheet. FIG. 7C also shows the PV structures positioned between the glass cover and backsheet. For example, PV structure 770 is shown to be between glass cover 764 and backsheet 766.

Figure 7D:
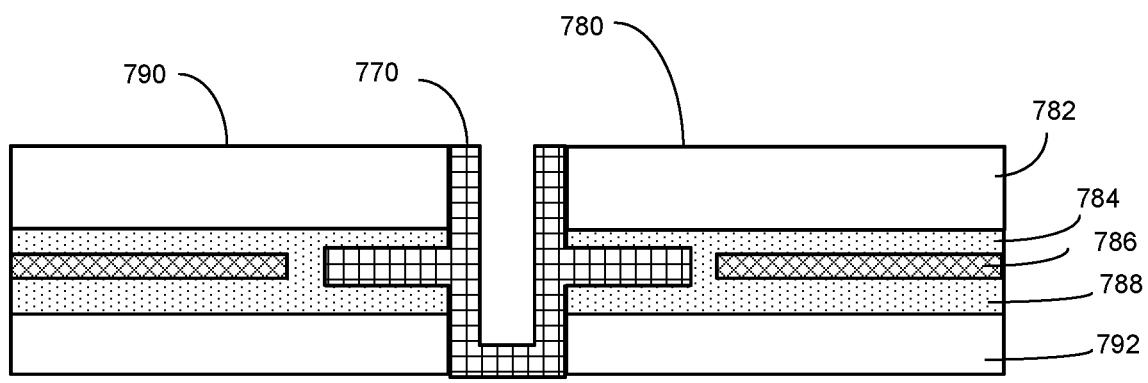
FIG. 7D illustrates a cross-sectional view of an exemplary spacer positioned between two adjacent roof tiles, according to an embodiment.

FIG. 7D illustrates a cross-sectional view of an exemplary spacer positioned between two adjacent roof tiles, according to an embodiment. In this example, PV roof tile 780 can include top glass cover 782, top encapsulant layer 784, an array of PV structures 786, bottom encapsulant layer 788, and backsheet 792. PV roof tile 790 can have a structure similar to that of PV roof tile 780. In FIG. 7D, spacer 770 is inserted between PV roof tiles 780 and 790. More specifically, in the example shown in FIG. 7D, the wings of spacer 770 can be inserted between top and bottom encapsulation layers of the PV tiles. For example, the right wing of spacer 770 can be inserted between top encapsulation layer 784 and bottom encapsulation layer 788. Note that top glass cover 782 and backsheet 792 can extend beyond array of PV structures 786 in order to provide space for the spacer's wings to be inserted into the encapsulant. This arrangement can prevent damage to the fragile PV structures by the spacer.

The width of the base of the spacer can be determined based on the dimension of the roof tiles. In some embodiments, the width of the base can be chosen to achieve a good aesthetic effect. For example, for PV roof tiles having a standard size, the width of the base of the spacer can be a few millimeters. There are no particular requirements for the thickness of the wings as long as they can be structurally strong and can allow a sufficient amount of encapsulant to flow between the wings and the front cover/backsheet. In some embodiments, the thickness of wings of the spacer can vary along its length (e.g., a taper can be introduced). Moreover, the surface of the wings can be textured to provide better adhesion between the wings and the encapsulant. Any space between the wings and top glass cover 782/backsheet 792 can be filled with encapsulant, particularly after lamination. The encapsulant material used to laminate the roof tiles, spacer, and/or inter-tile gaps can include PVB, TPO, EVA, TPD, or other materials. In the example shown in FIG. 7D, the top and bottom surfaces of spacer 770 can be aligned to the top and bottom surface of the PV tiles. In practice, the bottom surface of spacer 770 may be positioned above the bottom surface of the PV tiles. More specifically, if the backsheet in a multi-tile module is a continuous single sheet, the spacer can be positioned on top of the backsheet.

Figure 8A:
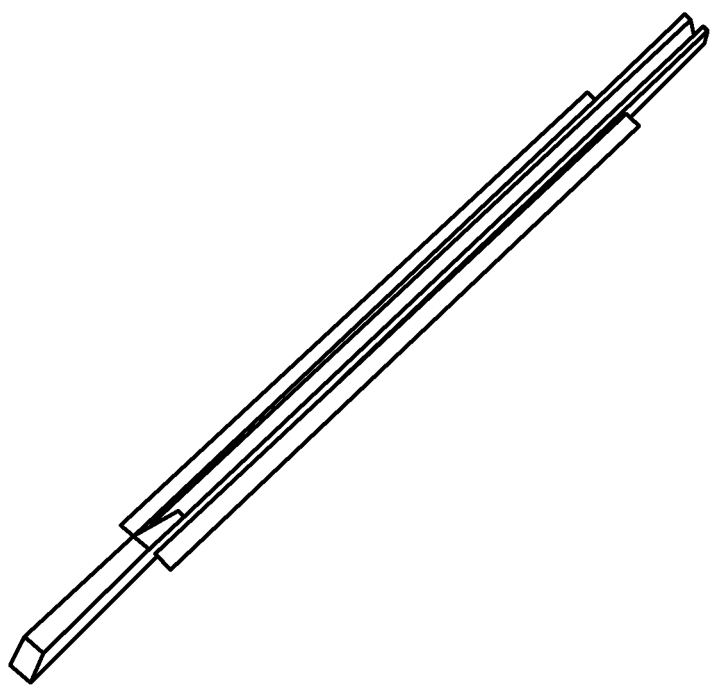
FIG. 8A illustrates an exemplary reinforcement spacer, according to an embodiment.
Figure 8B:
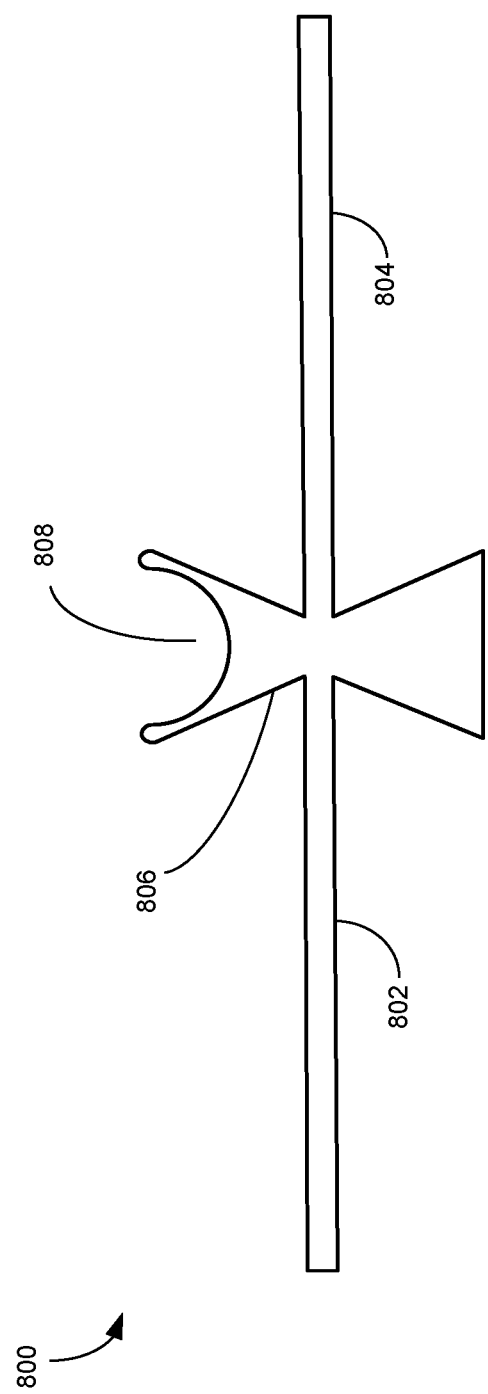
FIG. 8B illustrates an alternative reinforcement spacer, according to an embodiment.

In addition to the exemplary spacers shown in FIGS. 6A-7D, other types of spacers are also possible. For example, instead of extending throughout the length of the base, the two side wings may be shorter, such as partially extending along the length of the base, as shown in FIG. 8A. FIG. 8B illustrates an alternative reinforcement spacer, according to an embodiment. In this example, spacer 800 can include wings 802 and 804, top groove 808, and sloped sidewall 806. Similar to the U- or V-shaped spacers, there can be a balance between the length of wings 802 and 804 and the strength and flexibility of the multi-tile module. In the example shown in FIG. 8B, wings 802 and 804 are much longer than the wings shown in FIG. 6A. These longer wings provide a strong adhesion to the roof tiles and can allow adjacent roof tiles to bend at 90°. In this example, top groove 808 can also be curved rather than square, while still providing a visual appearance of a gap between the PV roof tiles. Finally, sloped sidewalls (e.g., sidewall 806) can conceal the visual appearance of encapsulant material when viewed from the top of the PV roof tiles. Moreover, these sloped sidewalls can guide the flow of encapsulant during lamination by preventing overflow of the encapsulant.

As discussed earlier, the reinforcement spacers can play an important role in the fabrication, installation, and operation of the PV roof tiles. The spacers in the various embodiments can offer a number of advantages over existing systems, including mechanical stability, encapsulant flow control, protection of electrical connections, and an aesthetic appearance similar to that of conventional roof tiles.

When inserted between the adjacent roof tiles, the spacer's wings can be embedded in encapsulant, and after lamination, the spacer's wings can be securely bound to the front and back covers of the adjacent roof tiles. The spacer can function as an 'embedded skeleton,' that is, it can provide a semi-rigid structure within the encapsulant material. Note that the encapsulant typically can be elastic but lack rigidity. By contrast, the combination of encapsulant and reinforcement spacer can provide an inter-tile joint or connection with both strength and flexibility. The disclosed spacer can also prevent reliability problems associated with delamination.

During the lamination process, the spacer can also direct and control the flow of encapsulant in the inter-tile space. In conventional approaches, it can be challenging to deposit encapsulant at the inter-tile gap in a consistent and controlled manner. The encapsulant may overflow, sometimes onto the glass top covers. The overflowed encapsulant can be aesthetically unsightly, and may impair the functioning of the inter-tile joint. It is also hard to remove the overflowed encapsulant from the glass top cover. The disclosed spacer can guide or direct the flow of encapsulant during lamination, preventing overflow. In some embodiments, the spacer can conceal the visual appearance of encapsulant.

During manufacturing, the spacer can facilitate alignment of the glass sheets within a multi-tile module. For example, the pre-laid spacers can be used as a visual guide for robotic arms that lay the top glass covers. Alternatively, the pre-laid spacers can be used as anchors for the glass covers. For example, when laying a glass cover, the robotic arm can push the glass cover against the spacer. Moreover, during final manufacturing steps (such as trimming and roof component attachment), it is necessary to handle the multi-tile module carefully to protect the bussing. The spacer can provide structural integrity and stiffness to the multi-tile module when the multi-tile module is being handled as a single piece.

The spacer and encapsulant together can also protect the PV structures and electrical bussing from weather elements, such as rain, condensation, and UV radiation, and can prevent moisture ingress into the roof tiles. Finally, the spacer can improve the aesthetic appearance of the roof tiles, reducing and/or hiding the presence of encapsulant, and providing the appearance of a clean gap between tiles.

Figure 9:
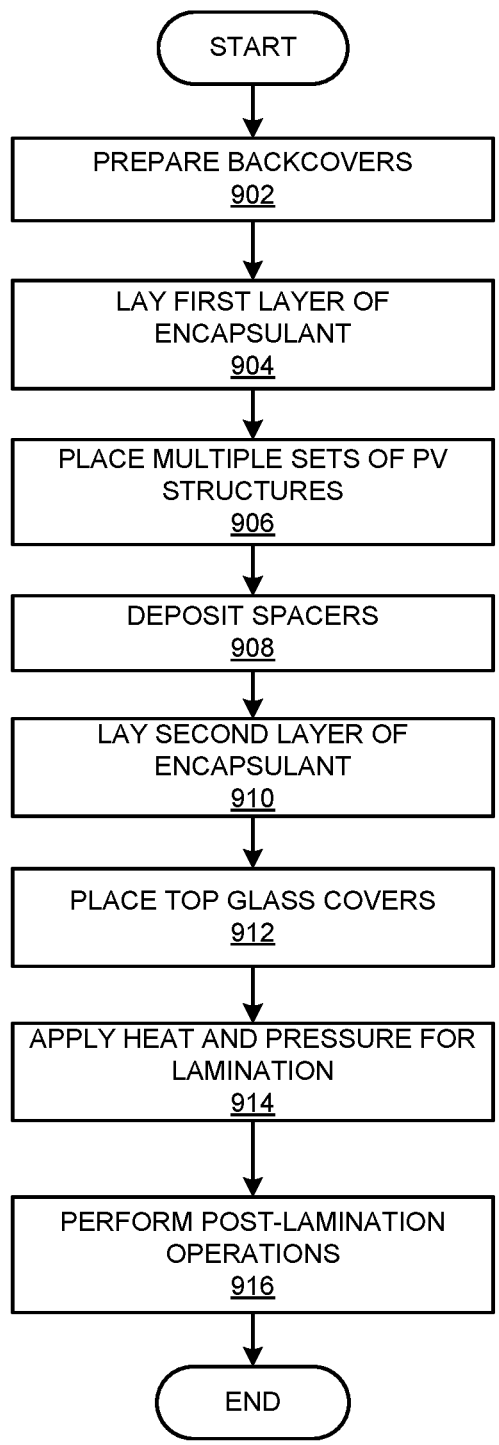
FIG. 9 presents a flowchart illustrating an exemplary process for fabricating a multi-tile module, according to an embodiment.

FIG. 9 presents a flowchart illustrating an exemplary process for fabricating a multi-tile module, according to an embodiment. During operation, one or more PV tile back covers can be prepared (operation 902). A back cover can be a glass cover or a PV backsheet. In some embodiments, a multi-tile module can include multiple PV backsheets, one for each tile. In such a scenario, a predetermined gap is maintained between two backsheets that are laid side by side. In alternative embodiments, the multi-tile module can include a single continuous backsheet. A first layer of encapsulant can be laid onto the backsheets (operation 904), and multiple sets of PV structures can be placed on the encapsulant layer (operation 906). The number of sets of PV structures corresponds to the number of tiles in the multi-tile module. In some embodiments, there are three tiles in each multi-tile module and three sets of PV structures are placed on the encapsulant layer. In some embodiments, each set of PV structures can include a plurality of cascaded strips, and a respective strip can be obtained by dividing a conventional square solar cell into multiple (e.g., three) strips.

Subsequently, one or more reinforcement spacers can be deposited in spaces between the sets of PV structures (operation 908). The location of each reinforcement spacer can be predetermined. For example, if the multi-tile module include three tiles, two spacers will be deposited, and the distance between the two spacers will be carefully controlled to allow a front glass cover of a tile to be fitted between the two spacers.

In some embodiments, the reinforcement spacer can include a base ridge and two side wings extending from the base ridge. The base ridge can shape like a rectangular prism that includes a groove on its top surface, providing a visual appearance of a gap between adjacent PV tiles. The base ridge of the spacer can further include a bottom channel configured to allow electrical connections (e.g., metallic tabs) connecting adjacent sets of PV structures to pass through.

In some embodiments, serial and/or parallel electrical connections among tiles within the same multi-tile module can be formed during fabrication, in order to simplify the installation of the tiles on a roof. More specifically, the inter-tile electrical connections have been made before the reinforcement spacers have been laid. Establishing the inter-tile connections can involve attaching the strain-relief connectors to edge busbars of each string of PV structures and then attaching metallic tabs to corresponding strain-relief connectors.

Subsequent to placing the spacers, a second layer of encapsulant can be laid, covering the PV structures and the wings of the spacers (operation 910). Using the spacers as visual guides or anchor points, top glass covers can then be placed on top of the newly laid encapsulant (operation 912). More specifically, each top glass cover can be placed above each set of PV structures. Next, heat and pressure can be applied to the entire multi-tile assembly, laminating the PV structures along with the wings of the spacers between the glass covers and backsheets (operation 914). As discussed previously, a particular set of PV structures is encapsulated between a particular front glass cover and a corresponding backsheet. Together they can form a PV roof tile. A spacer having its wings separately encapsulated within two PV adjacent roof tiles can mechanically couple these two PV roof tiles to each other.

Subsequent to cooling after lamination, the entire multi-tile assembly can go through post-lamination procedures, such as trimming (e.g., trimming of overflowed encapsulant), optional framing, and attachment of other roofing components (e.g., inter-module cable, nail strips, etc.) as a single piece to complete the module fabrication (operation 916).

The foregoing descriptions of various embodiments have been presented only for purposes of illustration and description. They are not intended to be exhaustive or to limit the present system to the forms disclosed. Accordingly, many modifications and variations will be apparent to practitioners skilled in the art. Additionally, the above disclosure is not intended to limit the present system.

What is claimed is:

1. A photovoltaic roof module, comprising:
a first photovoltaic roof tile and a second photovoltaic roof tile positioned adjacent to the first photovoltaic roof tile; and
a reinforcement spacer coupled to and positioned between the first and second photovoltaic roof tiles, wherein the spacer is configured to facilitate a semi-rigid joint between the first and second photovoltaic roof tiles, the reinforcement spacer comprising:
a base positioned between the first and second photovoltaic roof tiles, the base comprising a groove extending along a longitudinal axis on its sun-facing surface, thereby creating a visual effect of a gap between the first and second photovoltaic roof tiles; and
first and second wings extending from the base in opposite directions, wherein a respective wing is embedded within encapsulant positioned between front and back covers of a respective photovoltaic roof tile.

2. The photovoltaic roof module of claim 1, wherein the spacer is made of polyvinylidene fluoride (PVDF) or polytetrafluoroethylene (PTFE).

3. The photovoltaic roof module of claim 1, wherein a length of a respective wing is at least 3 mm.

4. The photovoltaic roof module of claim 1, wherein the base comprises a channel on its bottom surface configured to allow a metallic tab electrically coupling the first and second photovoltaic roof tiles to pass through.

5. The photovoltaic roof module of claim 1, wherein a surface of the respective wing is textured.

6. The photovoltaic roof module of claim 1, wherein each photovoltaic roof tile comprises a cascaded string of photovoltaic structures embedded inside the encapsulant.

7. A method for fabricating a photovoltaic roof module, the method comprising:
preparing first and second back covers;
laying a first layer of encapsulant on the first and second back covers;
placing first and second sets of photovoltaic structures on the first encapsulant layer, wherein the first and second sets of photovoltaic structures are positioned above the first and second back covers, respectively;
placing a reinforcement spacer between the first and second sets of photovoltaic structures, wherein the reinforcement spacer comprises a base, first and second wings extending from the base in opposite directions and a groove extending along a longitudinal axis on its sun-facing surface, wherein the first and second wings are positioned above the first layer of encapsulant and above, respectively, the first and second back covers;
placing a second layer of encapsulant;
placing first and second front covers over the second layer of encapsulant, wherein the first and second front covers are positioned above the first and second back covers, respectively; and
performing a lamination operation
wherein the groove creates a visual effect of a gap between the first and second sets of photovoltaic structures.

8. The method of claim 7, wherein the lamination operation is configured to:
encapsulate the first set of photovoltaic structures along with the first wing of the reinforcement spacer between the first front cover and the first back cover, and encapsulate the second set of photovoltaic structures along with the second wing of the reinforcement spacer between the second front cover and the second back cover.

9. The method of claim 7, wherein the reinforcement spacer is made of polyvinylidene fluoride (PVDF) or polytetrafluoroethylene (PTFE).

10. The method of claim 7, wherein a length of a respective wing is at least 3 mm.

11. The method of claim 7, wherein the base comprises a channel on its bottom surface configured to allow a metallic tab electrically coupling the first and second sets of photovoltaic structures to pass through.

12. The method of claim 7, wherein surfaces of the first and second wings are textured.

13. The method of claim 7, wherein each set of photovoltaic structures comprises a cascaded string of photovoltaic structures.

* * * * *